US010642728B2

(12) United States Patent
Porzio et al.

(10) Patent No.: US 10,642,728 B2
(45) Date of Patent: May 5, 2020

(54) STORAGE CLASS MEMORY STATUS

(71) Applicant: Micron Technology, Inc., Boise, ID (US)

(72) Inventors: Luca Porzio, Casalnuovo di Napoli (IT); Graziano Mirichigni, Vimercate (IT); Danilo Caraccio, Milan (IT)

(73) Assignee: Micron Technology, Inc., Boise, ID (US)

(*) Notice: Subject to any disclaimer, the term of this patent is extended or adjusted under 35 U.S.C. 154(b) by 92 days.

(21) Appl. No.: 15/908,545

(22) Filed: Feb. 28, 2018

(65) Prior Publication Data
US 2019/0266078 A1 Aug. 29, 2019

(51) Int. Cl.
| G06F 12/00 | (2006.01) |
| G06F 12/02 | (2006.01) |
| G06F 12/1009 | (2016.01) |
| G06F 3/06 | (2006.01) |
| G11C 29/52 | (2006.01) |

(52) U.S. Cl.
CPC ........ *G06F 12/0238* (2013.01); *G06F 3/064* (2013.01); *G06F 3/0673* (2013.01); *G06F 12/1009* (2013.01); *G11C 29/52* (2013.01); *G06F 2212/7201* (2013.01)

(58) Field of Classification Search
None
See application file for complete search history.

(56) References Cited

U.S. PATENT DOCUMENTS

| 5,450,560 | A | * | 9/1995 | Bridges | G06F 5/10 708/211 |
| 5,479,627 | A | * | 12/1995 | Khalidi | G06F 12/1027 711/205 |
| 5,584,038 | A | * | 12/1996 | Papworth | G06F 5/14 711/110 |
| 6,124,868 | A | * | 9/2000 | Asaro | G06F 9/3879 345/503 |
| 6,487,202 | B1 | * | 11/2002 | Klausmeier | H04L 12/5601 370/233 |
| 2011/0078364 | A1 | * | 3/2011 | Lee | G06F 12/0246 711/103 |
| 2017/0364262 | A1 | * | 12/2017 | Roberts | G06F 3/061 |

* cited by examiner

*Primary Examiner* — David Yi
*Assistant Examiner* — Craig S Goldschmidt
(74) *Attorney, Agent, or Firm* — Schwegman Lundberg & Woessner, P.A.

(57) ABSTRACT

Devices and techniques for storage class memory status are disclosed herein. A storage portion characteristics data structure is maintained. Here, the data structure includes an array of elements—where each element is sized to contain a reference to a storage portion in a storage class memory storage device, a first pointer to a first element in the array of elements, a second pointer to a second element in the array of elements, and a third pointer to a third element in the array of elements. The data structure includes a direction of pointer motion in which the second pointer precedes the third pointer and the first pointer precedes the second pointer with respect to the direction of pointer motion. A write request is performed to a storage portion reference retrieved from the first element. The first pointer is then advanced.

21 Claims, 6 Drawing Sheets

Free/Invalid Pointer List

STORAGE CLASS MEMORY STATUS

BACKGROUND

Memory devices are typically provided as internal, semiconductor, integrated circuits in computers or other electronic devices. There are many different types of memory, including volatile and non-volatile memory.

Volatile memory requires power to maintain its data, and includes random-access memory (RAM), dynamic random-access memory (DRAM), or synchronous dynamic random-access memory (SDRAM), among others.

Non-volatile memory can retain stored data when not powered, and includes flash memory, read-only memory (ROM), electrically erasable programmable ROM (EPROM), static RAM (SRAM), erasable programmable ROM (EPROM), resistance variable memory, such as phase-change random-access memory (PCRAM), resistive random-access memory (RRAM), magnetoresistive random-access memory (MRAM), among others.

Unlike NAND flash memories, storage class memory allows page-level erasures (e.g., 16 kilobit pages may be individually erased).

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
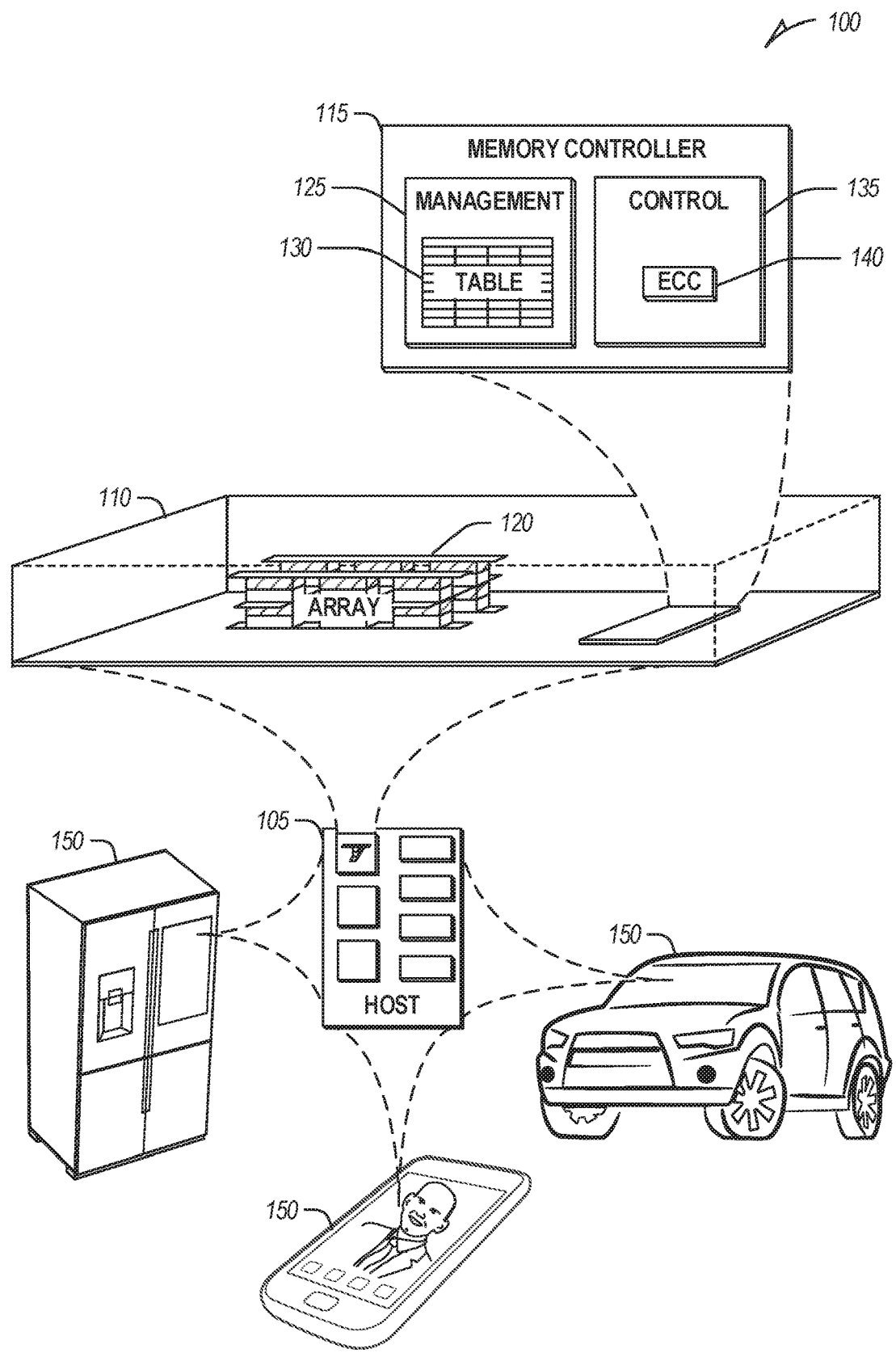
FIG. 1 illustrates an example of an environment including a storage class memory device.

Although storage class memory devices allow for page level erasure, it is generally beneficial to erase pages prior to executing a write on the page. Further, it is beneficial to perform the page erasure at an idle time for the device rather than as part of a write. Thus, like NAND flash devices, storage class memory devices may track valid and invalid pages, the invalid pages subject to cleaning during a maintenance operation to put them into a state favorable to writing.

Within managed memory devices for embedded and mobile segment markets (e.g., eMMC, UFS, etc.) it is common to split the available memory layout into three areas:

L2P area: Logic-to-Physical translation table; starting from the logical block address (LBA) provided by the host, this table helps to reconstruct the actual physical address at which the host data is stored. Depending on the physical interface used by the managed device, the LBA might be a 2-byte or 4-byte number. Internally, the physical block address (PBA) is a position within the underling non-volatile storage device that can be identified by a 4-byte number or a tuple of numbers (e.g. Die ID, Block ID, Page ID).

Data area: this is the largest area present on a managed memory device and it can be schematized as a linear array of pages of fixed size. For example, typical values on a device may be up to 16 KB pages. In this area the data contents coming from the host are stored.

Status Information: in order to ensure robust data handling as well as translation layer execution performances, other data structures that store status information of pages and the device in general may be employed. For example, within each page a small number of bits may be dedicated to ECC information. In an example, in a separate area of the storage class memory array, information bits are dedicated to store the health status of Blocks (e.g., Bad Block information). In an example, this area can be partly scattered over the pages (e.g. ECC bits) or partly stored in a dedicated and separated array partition (e.g. Bad Block information).

Tracking valid, invalid, free, or unused pages in a table may involve significant overhead. This overhead may take the form of data (e.g., including a page address as well as it status of valid or invalid), processing overhead (e.g., reordering page addresses in a structure as they move from valid to invalid or back again, or searching for invalid pages upon which to perform maintenance), or both. For example, as the host writes data contents to the storage class memory device, this data is written into storage class memory pages and their "written" status is stored in other pages of the storage class memory array, often called namely the "Page Status Information". Also due to data integrity concerns, often the data contents are copied to a new storage class memory page instead of rewriting the old page. These Copy-On-Write (COW) techniques set the old pages (e.g., those being changed) to "invalid" and the new pages are set to "valid." A "free" or "clean" page neither contains valid data nor maintenance to hold valid data. Generally, a background process running in the managed storage class memory device may decide when to periodically scan the statuses of the storage class memory data pages and transform an "Invalid" page into a "clean" page, which can then be used for writing.

The page status information can be organized in several ways with different management policies. For example, a bit map of the page statuses can be used and stored in the storage class memory array itself. However, a simple bit map containing the status of a given page (the "Valid/Invalid/Free" status) may require many iterations to scan and look for invalid/free pages in embedded storage solutions where computational resources are limited.

To address the issues noted above with page status tracking, an efficient data structure to store the status of the pages is proposed. This data structure organizes the page status by position within the data structure to efficiently locate invalid pages, for example, without having to move pages from one portion of the data structure to another. Accordingly, the described data structure avoids the need to store information in bit maps and reduces the search process to retrieve the first free/invalid page for a write or maintenance operation. The data structure is arranged as a circular array with three pointers. Elements of the array identify pages. The first pointer indicates a next free page, the second pointer indicates one end of a list of invalid pages, and a third pointer indicates the other end of the invalid pages. When a free page is sought (e.g., for writing), the first pointer is consulted, the page is written to, and the first pointer is incremented towards the second pointer. When a page is invalidated, the third pointer is consulted, the invalid page identification is written to the third pointer location, and the third pointer is incremented towards the first pointer and away from the second pointer. When invalid pages are sought for maintenance, the second pointer is consulted, the page found there is addressed, and the second pointer increments towards the third pointer. In this manner, the pointers simply move in a single direction, circularly around the data structure, and yet locating any given page for a write, a maintenance operation, or to record an invalid page is a single lookup. This results in a compact and computationally efficient structure for tracking valid, invalid, or clean pages in a storage class memory device. Additional details and examples are provided below.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., internet-of-things (IoT) devices, etc.), have varying storage needs depending on, among other things, the type of electronic device, use environment, performance expectations, etc.

Electronic devices can be broken down into several main components: a processor (e.g., a central processing unit (CPU) or other main processor); memory (e.g., one or more volatile or non-volatile random-access memory (RAM) memory device, such as dynamic RAM (DRAM), mobile or low-power double-data-rate synchronous DRAM (DDR SDRAM), etc.); and a storage device (e.g., non-volatile memory (NVM) device, such as flash memory, read-only memory (ROM), an SSD, an MMC, or other memory card structure or assembly, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc.

FIG. 1 illustrates an example of an environment 100 including a host device 105 and a storage class memory device 110 configured to communicate over a communication interface. The host device 105 or the memory device 110 may be included in a variety of products 150, such as Internet of Things (IoT) devices (e.g., a refrigerator or other appliance, sensor, motor or actuator, mobile communication device, automobile, drone, etc.) to support processing, communications, or control of the product 150.

The memory device 110 includes a memory controller 115 and a memory array 120 comprising variable resistive cells organized into pages, blocks, and die. In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of the host device 105. In other examples, the memory device 110 can be a portion of an integrated circuit (e.g., system on a chip (SOC), etc.), stacked or otherwise included with one or more other components of the host device 105.

One or more communication interfaces can be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC interface, or one or more other connectors or interfaces. The host device 105 can include a host system, an electronic device, a processor, a memory card reader, or one or more other electronic devices external to the memory device 110. In some examples, the host 105 may be a machine having some portion, or all, of the components discussed in reference to the machine 600 of FIG. 6.

The memory controller 115 can receive instructions from the host 105, and can communicate with the memory array 120, such as to transfer data to (e.g., write or erase) or from (e.g., read) one or more of the memory cells, planes, sub-blocks, blocks, or pages of the memory array 120. The memory controller 115 can include, among other things, circuitry or firmware, including one or more components or integrated circuits. For example, the memory controller 115 can include one or more memory control units, circuits, or components configured to control access across the memory array 120 and to provide a translation layer between the host 105 and the memory device 110. The memory controller 115 can include one or more input/output (I/O) circuits, lines, or interfaces to transfer data to or from the memory array 120. The memory controller 115 can include a memory manager 125 and an array controller 135.

The memory manager 125 can include, among other things, circuitry or firmware, such as a number of components or integrated circuits associated with various memory management functions, such as error detection or correction among others. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array or one or more memory cells coupled to the memory controller 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts is above a threshold, the bit error can be referred to as an uncorrectable bit error. The management tables 130 can maintain a count of correctable or uncorrectable bit errors, among other things.

The memory controller 115, or the memory manager 125, is arranged to maintain a storage portion characteristics data structure, which may be part of the management tables 130. This data structure includes an array of elements, each element sized to contain a reference to a storage portion in the storage class memory storage device 110 (e.g., in array 120). The data structure also includes a first pointer to a first element in the array of elements, a second pointer to a second element in the array of elements, and a third pointer to a third element in the array of elements. In an example, the data structure includes a direction of pointer motion. In this example, the second pointer precedes the third pointer and the first pointer precedes the second pointer with respect to the direction of pointer motion. The direction of pointer motion constrains the way in which the pointer moves within the data structure. Thus, if the data structure is an array of size five, and an increment locates a pointer at (current_array_index+increment modulo 5), the direction of pointer motion defines the sign of the increment (e.g., the increment may only be a positive or may only be negative).

In an example, elements in the array of elements between the first pointer inclusive and the second pointer exclusive (e.g., these elements include the first pointer and not the second pointer) include storage portion references to storage portions in which data may be written. In an example, elements in the array of elements between the second pointer inclusive and the third pointer exclusive (e.g., these elements including the second pointer and not the third pointer) include storage portion references to storage portions that are invalid. In an example, the array of elements is a circular array. In these examples, the pointers define boundaries of contiguous elements with the same status. Thus, the elements between the first pointer and the second pointer all share the same status.

Figure 4:
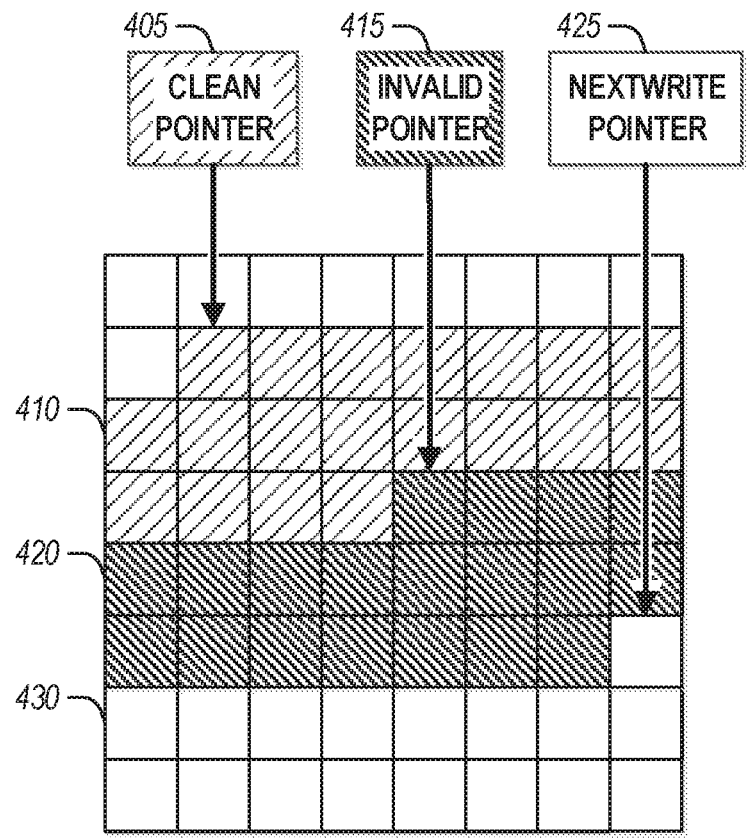
FIG. 4 illustrates an example of a data structure for storage class memory status management.

In an example, the first pointer, the second pointer, and the third pointer are stored in a reserved area of the storage class memory storage device that is distinct from a logical-to-physical translation area and a data area. In this example, the storage location of the data structure is separated from other information held by the storage class memory array 120. Such an area may include an auxiliary data area in a page, a specific block, etc. In an example, wherein the entire data structure is stored in the reserved area. This example illustrates the storing of the elements as well as the pointers in the reserved area. In an example, only the pointers are stored in the reserved area and the array is stored elsewhere (e.g., a data area). FIG. 4 below illustrates and describes an example of this data structure.

The memory controller 115 uses the data structure for a variety of operations. For example, the memory controller 115 is arranged to receive a write request (e.g., from the host 105). To complete the write request, the memory controller 115 is arranged to retrieve a storage portion reference from the data structure element identified by the first pointer (e.g., the first element). The memory controller 115 is arranged to then perform the write request using the page in the first element. Once completed, the first pointer is advanced in the data structure. Thus, a single lookup using the first pointer reveals the next available page for writing and updating the data structure to indicate that the page has been written to is as simple as increase the data structure index of the pointer by one.

In the case of a storage portion update (e.g., updating the data on a page), the memory controller 115 is arranged to retrieve an original storage portion reference for the write request from a translation table. The new data is written to a new page (e.g., as indicated by the first pointer) and the original portion is written to the third pointer element in the data structure to indicate the original page to be invalid. The memory controller 115 is then arranged to increment the third pointer. Again, the number of lookups is two (e.g., the first pointer to determine a write page, and the third pointer to determine where to track the invalidated page) and the data structure management options are two (e.g., increase the index of both the first pointer and the third pointer by one each).

The memory controller 115 is arranged to perform maintenance upon a storage portion with a reference stored in the second element (e.g., the element indicated by the second pointer) and advance the second pointer in response to the maintenance. Thus, the page indicated by the second element is initialized to a given logical state, for example, and the second pointer is incremented by one. Because the pages from the first pointer to the second pointer are free pages, incrementing the second pointer automatically places the clean page into the free pages list. In an example, the maintenance is performed in response to a maintenance trigger. In an example, the maintenance trigger is an idle condition of the storage device 110. In an example, the maintenance trigger is a number of elements in the array of elements between the first pointer and the second pointer below a threshold. Thus, here, the maintenance is triggered when there are too few free pages in the data structure. In an example, the maintenance includes putting the storage portion in a given logical state.

Figure 2:
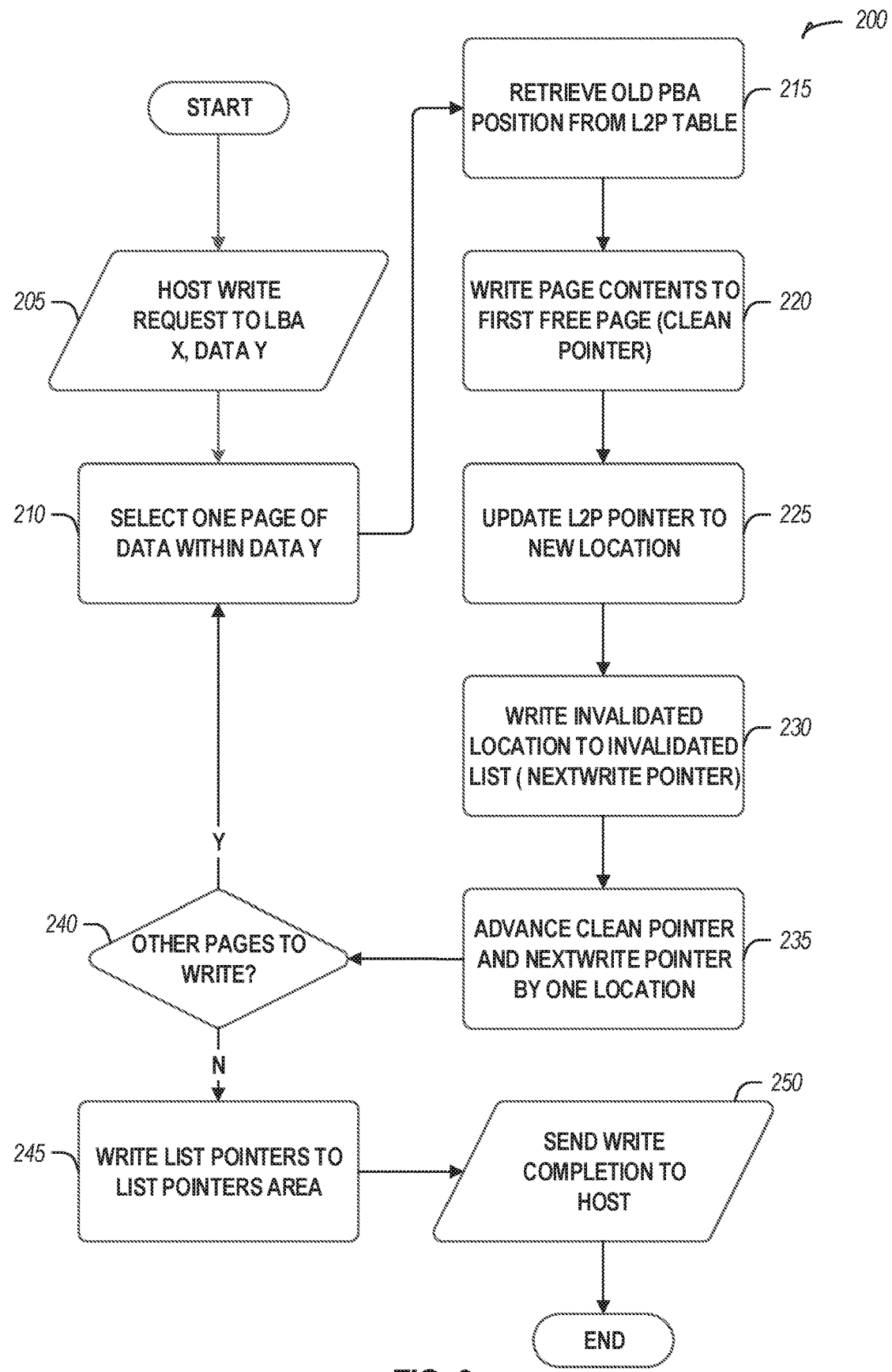
FIG. 2 illustrates a flowchart of a method for using storage class memory status during a write.

FIG. 2 illustrates a flowchart of a method 200 for using storage class memory status during a write. Thus, method illustrates the data, operations, and decisions made by a memory controller using the disclosed data structure. The operations of the method 200 are performed using hardware, such as that described above with respect to FIG. 1 or below with respect to FIG. 6 (e.g., processing circuitry).

A request (data 205) is received to write data Y to a logical block address X. The controller selects a page of data within Y (operation 210) and uses this to retrieve the physical position of the already written data (operation 215) from the logical-to-physical table. The controller then uses the clean pointer in the data structure to locate a next clean page and write the Y page contents to the clean page (operation 220) and updates the logical-to-physical mapping (operation 225). The original page is written to the data structure at the location indicated by the next_write pointer (230), and both the clean pointer and the next_write pointers are advanced. The method 200 repeats if there are other pages in Y to write (decision 240). Otherwise, the advanced (e.g., updated) pointers are written to the storage class memory area designated for the pointers (operation 245), and a write-complete indicator (data 250) is transmitted to the host.

In an example, logical-to-physical table entries and the pointers may be cached in RAM without necessarily writing to their respective areas for each operation. This data may be flushed to the storage class memory array periodically, during idle time, or in response to other triggers.

Figure 3:
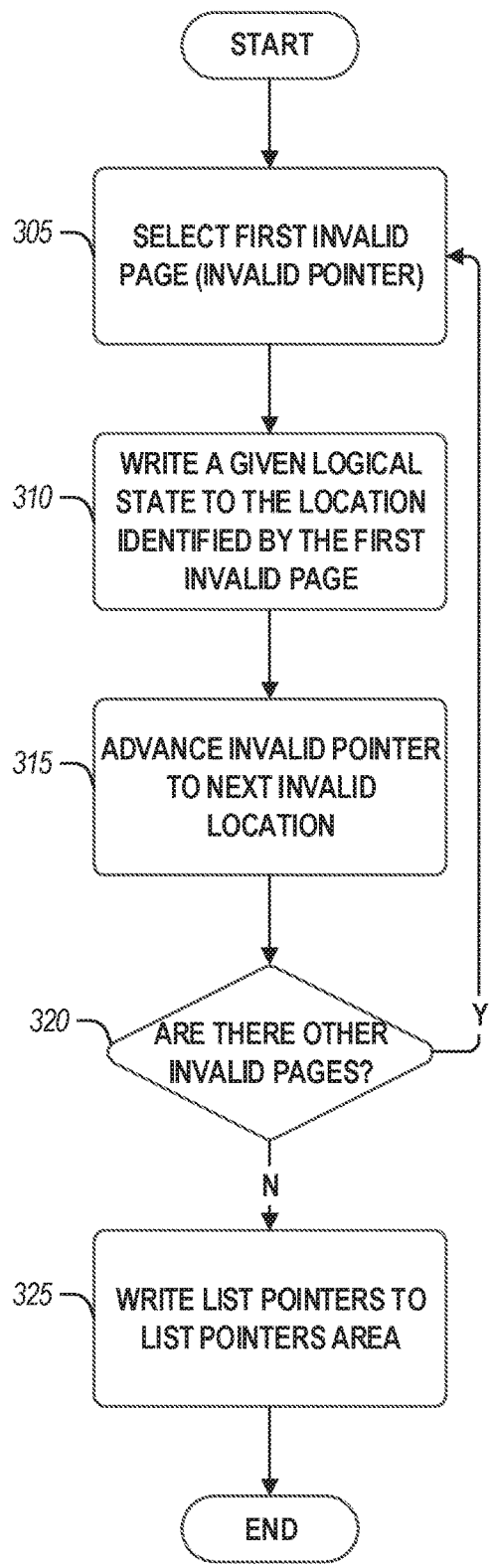
FIG. 3 illustrates a flowchart of a method for using storage class memory status during maintenance.

FIG. 3 illustrates a flowchart of a method 300 for using storage class memory status during maintenance. The operations of the method 300 are performed using hardware, such as that described above with respect to FIG. 1 or below with respect to FIG. 6 (e.g., processing circuitry).

On Idle time, upon free list emptying, or in response to another trigger, a maintenance (e.g., cleaning) operation may commence. Generally, the controller selects a first invalid page by retrieving its reference from the data structure element indicated by the invalid pointer (operation 305). The controller then writes a single value to the bits of the page, such as all zeroes (operation 310). The controller then advances the invalid pointer (operation 315). The process repeats while there are invalid pages (decision 320) or until it is interrupted by a higher priority operation, for example. To finish, the controller writes the pointers (e.g., the updated invalid pointer) to the pointer storage area on the storage class memory device (operation 325) and exits.

The cleaning process is responsible of advancing the invalid pointer by freeing (i.e. writing all zeros) to the location indirectly pointed by the invalid pointer.

FIG. 4 illustrates an example of a data structure for storage class memory status management. As noted above, either the pointers, or the entire data structure, may be stored in a separate area that is reserved to store status information of the data area. The data structure is schematized as a linear array of pointers. This linear array is accessed as a circular array with three relevant pointers:

Clean list pointer (e.g., the clean pointer) 405: identifies where the list of clean pages 410 starts. Every time the host writes data contents to the storage, the page on top of this list is selected to store the data contents and the clean pointer 405 advances one or more locations (e.g., indexes) in the array.

Invalid list pointer (e.g., the invalid pointer 415): identifies where the list of available clean pages ends and the list of invalidated pages 420 starts. Each time the cleaning process starts, the process selects the first invalid page pointed by the invalid pointer 415 and frees it by writing all zeros to the page. Once the cleaning process is over, the invalid pointer 415 is advanced to the next location.

Next Invalid Write location pointer (e.g., next_write pointer 425): identifies where the list of invalid pages 420 ends, or where the list of unencumbered (e.g., neither free nor invalid) pages 430 begins. Upon invalidation of a page within the storage class memory array, the invalidated page is written into the location identified by next_write pointer 425 and then the next_write pointer 425 is advanced to the next location.

The array controller 135 can include, among other things, circuitry or components configured to control memory operations associated with writing data to, reading data from, or erasing one or more memory cells of the memory device 110 coupled to the memory controller 115. The memory operations can be based on, for example, host commands received from the host 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory device 110 coupled to the memory controller 115. The memory controller 115 can be configured to actively detect and recover from error occurrences (e.g., bit errors, operation errors, etc.) associated with various operations or storage of data, while maintaining integrity of the data transferred between the host 105 and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors.

The memory array 120 can include several memory cells arranged in, for example, a number of devices, planes, sub-blocks, blocks, or pages. As one example, a 48 GB memory device can include 18,592 bytes (B) of data per page (16,384+2208 bytes), 1536 pages per block, 548 blocks per plane, and 4 or more planes per device.

In operation, data is typically written to or read from the memory device 110 in pages, and erased in pages. However, one or more memory operations (e.g., read, write, erase, etc.) can be performed on larger or smaller groups of memory cells, as desired. The data transfer size of a NAND memory device 110 is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes, or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate).

Figure 5:
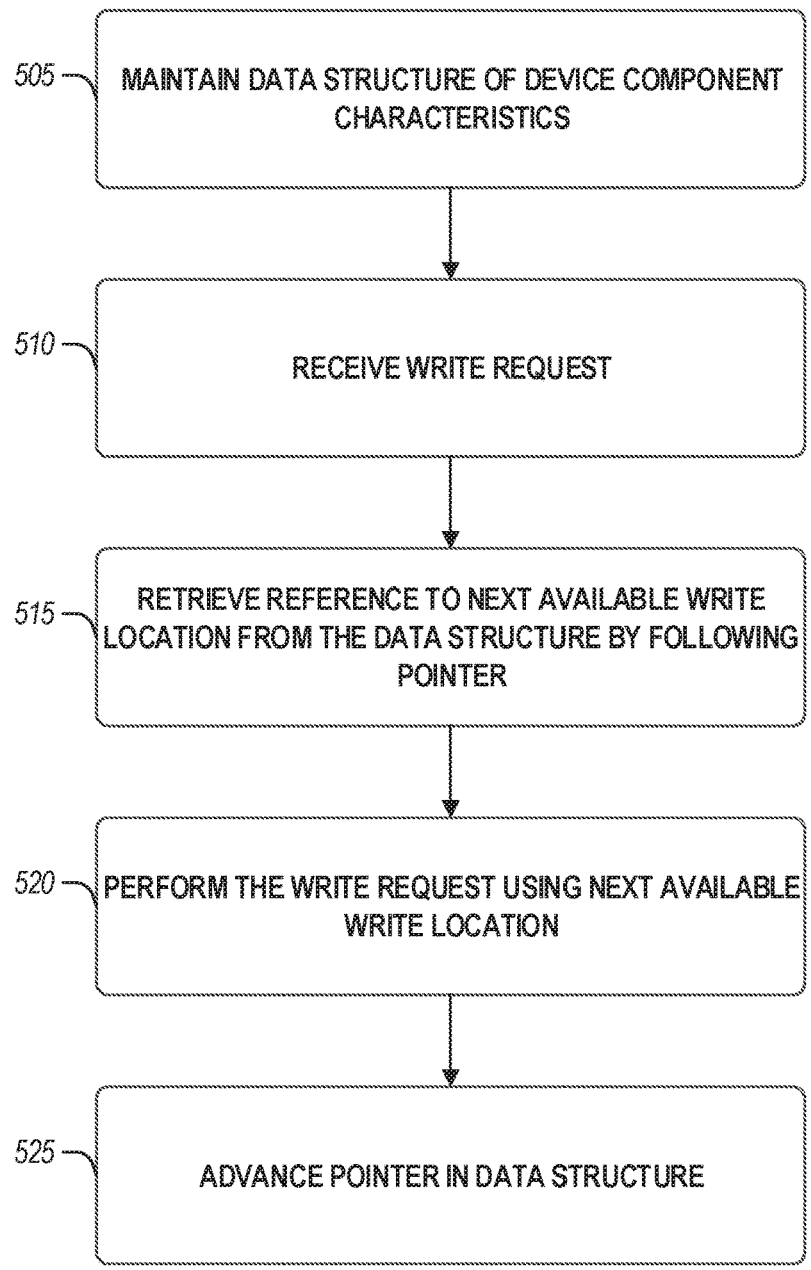
FIG. 5 illustrates a flowchart of a method for storage class memory status.

FIG. 5 illustrates a flowchart of a method 500 for storage class memory status. The operations of the method 500 are performed using hardware, such as that described above with respect to FIG. 1 or below with respect to FIG. 6 (e.g., processing circuitry).

At operation 505, a storage portion characteristics data structure is maintained. In an example, the data structure includes an array of elements—where each element is sized to contain a reference to a storage portion in a storage class memory storage device—a first pointer to a first element in the array of elements, a second pointer to a second element in the array of elements, and a third pointer to a third element in the array of elements. In an example, the data structure includes a direction of pointer motion. In this example, the second pointer precedes the third pointer and the first pointer precedes the second pointer with respect to the direction of pointer motion.

In an example, elements in the array of elements between the first pointer inclusive and the second pointer exclusive (e.g., these elements include the first pointer and not the second pointer) include storage portion references to storage portions in which data may be written. In an example, elements in the array of elements between the second pointer inclusive and the third pointer exclusive (e.g., these elements including the second pointer and not the third pointer) include storage portion references to storage portions that are invalid. In an example, the array of elements is a circular array.

In an example, the first pointer, the second pointer, and the third pointer are stored in a reserved area of the storage class memory storage device that is distinct from a logical-to-physical translation area and a data area. In an example, wherein the entire data structure is stored in the reserved area.

At operation 510, a write request is received.

At operation 515, a storage portion reference is retrieved from the first element. In an example, the storage portion is a page.

At operation 520, the write request is performed to the storage portion reference.

At operation 525, the first pointer is advanced.

The operations of the method 500 may be extended to include retrieving an original storage portion reference for the write request from a translation table. In an example, the write request updates a previously stored value on the original storage portion. The original storage portion reference may then be written to the third element and the third pointer is advanced.

The operations of the method 500 may be extended to include performing maintenance upon a storage portion with a reference stored in the second element and advancing the second pointer in response to the maintenance. In an example, the maintenance is performed in response to a maintenance trigger. In an example, the maintenance trigger is an idle condition of the storage device. In an example, the maintenance trigger is a number of elements in the array of elements between the first pointer and the second pointer below a threshold. In an example, the maintenance includes writing zeroes in every bit of the storage portion.

Figure 6:
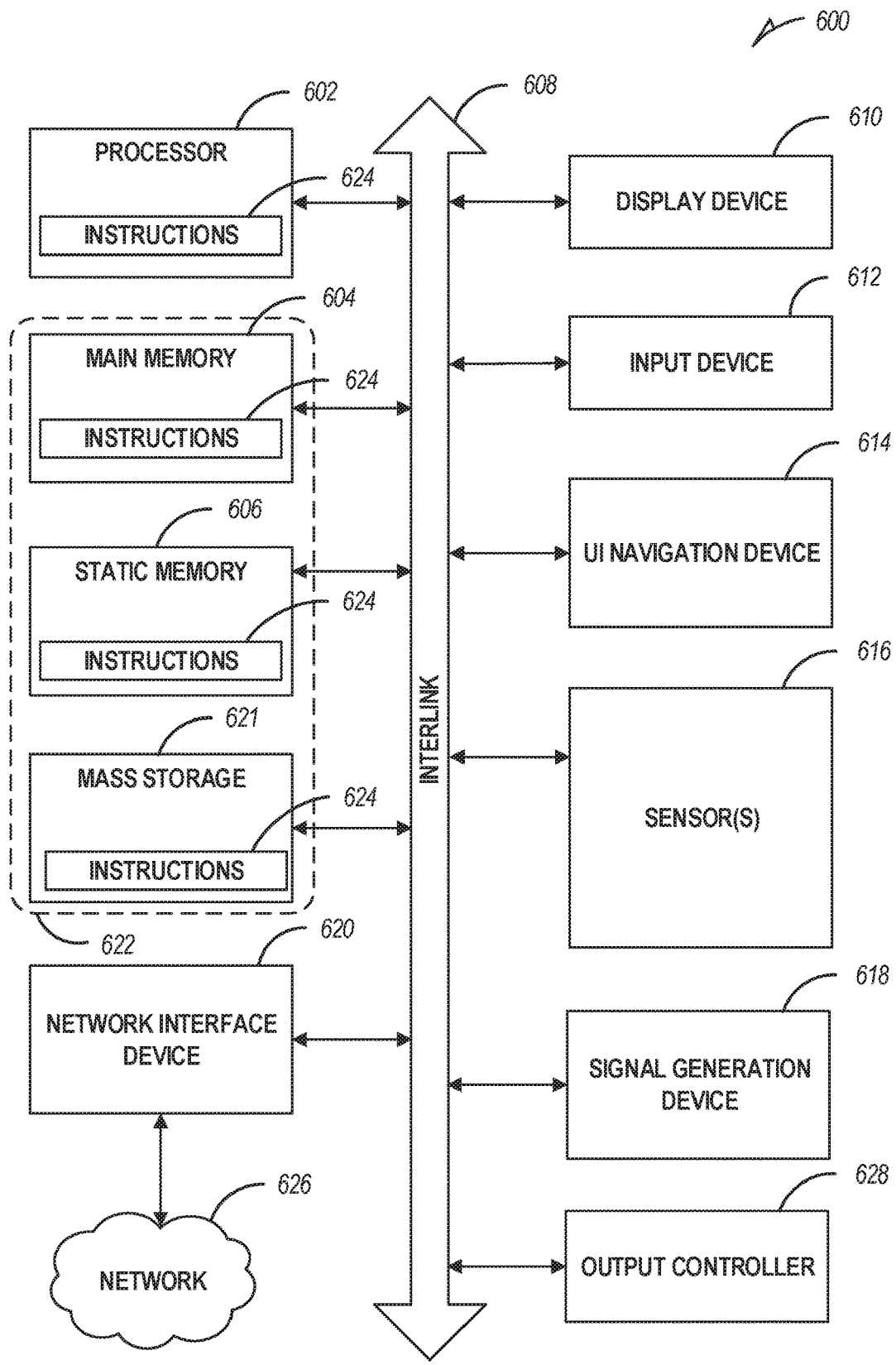
FIG. 6 is a block diagram illustrating an example of a machine upon which one or more embodiments may be implemented.

FIG. 6 illustrates a block diagram of an example machine 600 upon which any one or more of the techniques (e.g., methodologies) discussed herein may perform. In alternative embodiments, the machine 600 may operate as a standalone device or may be connected (e.g., networked) to other machines. In a networked deployment, the machine 600 may operate in the capacity of a server machine, a client machine, or both in server-client network environments. In an example, the machine 600 may act as a peer machine in peer-to-peer (P2P) (or other distributed) network environment. The machine 600 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer readable medium physically modified (e.g., magnetically, electrically, movable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 600 (e.g., the host device 105, the memory device 110, etc.) may include a hardware processor 602 (e.g., a central processing unit (CPU), a graphics processing unit (GPU), a hardware processor core, or any combination thereof, such as the memory controller 115, etc.), a main memory 604 and a static memory 606, some or all of which may communicate with each other via an interlink (e.g., bus) 608. The machine 600 may further include a display unit 610, an alphanumeric input device 612 (e.g., a keyboard), and a user interface (UI) navigation device 614 (e.g., a mouse). In an example, the display unit 610, input device 612 and UI navigation device 614 may be a touch screen display. The machine 600 may additionally include a storage device (e.g., drive unit) 616, a signal generation device 618 (e.g., a speaker), a network interface device 620, and one or more sensors 616, such as a global positioning system (GPS) sensor, compass, accelerometer, or other sensor. The machine 600 may include an output controller 628, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 616 may include a machine readable medium 622 on which is stored one or more sets of data structures or instructions 624 (e.g., software) embodying or utilized by any one or more of the techniques or functions described herein. The instructions 624 may also reside, completely or at least partially, within the main memory 604, within static memory 606, or within the hardware processor 602 during execution thereof by the machine 600. In an example, one or any combination of the hardware processor 602, the main memory 604, the static memory 606, or the storage device 616 may constitute the machine readable medium 622.

While the machine readable medium 622 is illustrated as a single medium, the term "machine readable medium" may include a single medium or multiple media (e.g., a centralized or distributed database, or associated caches and servers) configured to store the one or more instructions 624.

The term "machine readable medium" may include any medium that is capable of storing, encoding, or carrying instructions for execution by the machine 600 and that cause the machine 600 to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 624 (e.g., software, programs, an operating system (OS), etc.) or other data are stored on the storage device 621, can be accessed by the memory 604 for use by the processor 602. The memory 604 (e.g., DRAM) is typically fast, but volatile, and thus a different type of storage than the storage device 621 (e.g., an SSD), which is suitable for long-term storage, including while in an "off" condition. The instructions 624 or data in use by a user or the machine 600 are typically loaded in the memory 604 for use by the processor 602. When the memory 604 is full, virtual space from the storage device 621 can be allocated to supplement the memory 604; however, because the storage 621 device is typically slower than the memory 604, and write speeds are typically at least twice as slow as read speeds, use of virtual memory can greatly reduce user experience due to storage device latency (in contrast to the memory 604, e.g., DRAM). Further, use of the storage device 621 for virtual memory can greatly reduce the usable lifespan of the storage device 621.

In contrast to virtual memory, virtual memory compression (e.g., the Linux® kernel feature "ZRAM") uses part of the memory as compressed block storage to avoid paging to the storage device 621. Paging takes place in the compressed block until it is necessary to write such data to the storage device 621. Virtual memory compression increases the usable size of memory 604, while reducing wear on the storage device 621.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 624 may further be transmitted or received over a communications network 626 using a transmission medium via the network interface device 620 utilizing any one of a number of transfer protocols (e.g., frame relay, Internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 620 may include one or more physical jacks (e.g., Ethernet, coaxial, or phone jacks) or one or more antennas to connect to the communications network 626. In an example, the network interface device 620 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 600, and includes digital or analog communications signals or other intangible medium to facilitate communication of such software.

ADDITIONAL EXAMPLES

Example 1 is a device for storage class memory status, the device comprising: a storage class memory array; and a controller including processing circuitry to: maintain a storage portion characteristics data structure, the data structure comprising: an array of elements, each element sized to contain a reference to a storage portion in the storage class memory array; a first pointer to a first element in the array of elements; a second pointer to a second element in the array of elements; and a third pointer to a third element in the array of elements, the data structure including a direction of pointer motion, the second pointer preceding the third pointer and the first pointer preceding the second pointer with respect to the direction of pointer motion; receive a write request; retrieve a storage portion reference from the first element; perform the write request to the storage portion reference; and advance the first pointer.

In Example 2, the subject matter of Example 1 includes, wherein the processing circuitry is to: retrieve an original storage portion reference for the write request from a translation table, the write request updating a previously stored value on the original storage portion; write the original storage portion reference to the third element; and advance the third pointer.

In Example 3, the subject matter of Examples 1-2 includes, wherein the processing circuitry is to: perform maintenance upon a storage portion with a reference stored in the second element; and advance the second pointer in response to the maintenance.

In Example 4, the subject matter of Example 3 includes, wherein the maintenance is performed in response to a maintenance trigger.

In Example 5, the subject matter of Example 4 includes, wherein the maintenance trigger is an idle condition of the storage device.

In Example 6, the subject matter of Examples 4-5 includes, wherein the maintenance trigger is a number of elements in the array of elements between the first pointer and the second pointer below a threshold.

In Example 7, the subject matter of Examples 1-6 includes, wherein elements in the array of elements between the first pointer and the second pointer, including the first pointer and not the second pointer, include storage portion references to storage portions in which data may be written.

In Example 8, the subject matter of Examples 1-7 includes, wherein elements in the array of elements between the second pointer and the third pointer, including the second pointer and not the third pointer, include storage portion references to storage portions that are invalid.

In Example 9, the subject matter of Examples 1-8 includes, wherein the array of elements is a circular array.

In Example 10, the subject matter of Examples 1-9 includes, wherein the first pointer, the second pointer, and the third pointer are stored in a reserved area of the storage class memory array that is distinct from a logical-to-physical translation area and a data area of the storage class memory array.

In Example 11, the subject matter of Example 10 includes, wherein the entire data structure is stored in the reserved area.

In Example 12, the subject matter of Examples 1-11 includes, wherein the entire data structure is stored in an area mixed with logical-to-physical translation area of the storage class memory array.

In Example 13, the subject matter of Examples 1-12 includes, wherein the storage portion is a page of the storage class memory array.

Example 14 is a method for storage class memory status, the method comprising: maintaining a storage portion characteristics data structure, the data structure comprising: an array of elements, each element sized to contain a reference to a storage portion in a storage class memory storage device; a first pointer to a first element in the array of elements; a second pointer to a second element in the array of elements; and a third pointer to a third element in the array of elements, the data structure including a direction of pointer motion, the second pointer preceding the third pointer and the first pointer preceding the second pointer with respect to the direction of pointer motion; receiving a write request; retrieving a storage portion reference from the first element; performing the write request to the storage portion reference; and advancing the first pointer.

In Example 15, the subject matter of Example 14 includes, retrieving an original storage portion reference for the write request from a translation table, the write request updating a previously stored value on the original storage portion; writing the original storage portion reference to the third element; and advancing the third pointer.

In Example 16, the subject matter of Examples 14-15 includes, performing maintenance upon a storage portion with a reference stored in the second element; and advancing the second pointer in response to the maintenance.

In Example 17, the subject matter of Example 16 includes, wherein the maintenance is performed in response to a maintenance trigger.

In Example 18, the subject matter of Example 17 includes, wherein the maintenance trigger is an idle condition of the storage device.

In Example 19, the subject matter of Examples 17-18 includes, wherein the maintenance trigger is a number of elements in the array of elements between the first pointer and the second pointer below a threshold.

In Example 20, the subject matter of Examples 14-19 includes, wherein elements in the array of elements between the first pointer and the second pointer, including the first pointer and not the second pointer, include storage portion references to storage portions in which data may be written.

In Example 21, the subject matter of Examples 14-20 includes, wherein elements in the array of elements between the second pointer and the third pointer, including the second pointer and not the third pointer, include storage portion references to storage portions that are invalid.

In Example 22, the subject matter of Examples 14-21 includes, wherein the array of elements is a circular array.

In Example 23, the subject matter of Examples 14-22 includes, wherein the first pointer, the second pointer, and the third pointer are stored in a reserved area of the storage class memory storage device that is distinct from a logical-to-physical translation area and a data area.

In Example 24, the subject matter of Example 23 includes, wherein the entire data structure is stored in the reserved area.

In Example 25, the subject matter of Examples 14-24 includes, wherein the entire data structure is stored in an area mixed with logical-to-physical translation area.

In Example 26, the subject matter of Examples 14-25 includes, wherein the storage portion is a page.

Example 27 is at least one machine readable medium including instructions that, when executed by processing circuitry, cause the processing circuitry to perform any method of Examples 14-26.

Example 28 is a device including means to perform any method of Examples 14-26.

Example 29 is at least one computer readable medium including instructions that, when executed by processing circuitry, cause the processing circuitry to perform operations comprising: maintaining a storage portion characteristics data structure, the data structure comprising: an array of elements, each element sized to contain a reference to a storage portion in a storage class memory storage device; a first pointer to a first element in the array of elements; a second pointer to a second element in the array of elements; and a third pointer to a third element in the array of elements, the data structure including a direction of pointer motion, the second pointer preceding the third pointer and the first pointer preceding the second pointer with respect to the direction of pointer motion; receiving a write request; retrieving a storage portion reference from the first element; performing the write request to the storage portion reference; and advancing the first pointer.

In Example 30, the subject matter of Example 29 includes, wherein the operations further comprise: retrieving an original storage portion reference for the write request from a translation table, the write request updating a previously stored value on the original storage portion; writing the original storage portion reference to the third element; and advancing the third pointer.

In Example 31, the subject matter of Examples 29-30 includes, wherein the operations further comprise: performing maintenance upon a storage portion with a reference stored in the second element; and advancing the second pointer in response to the maintenance.

In Example 32, the subject matter of Example 31 includes, wherein the maintenance is performed in response to a maintenance trigger.

In Example 33, the subject matter of Example 32 includes, wherein the maintenance trigger is an idle condition of the storage device.

In Example 34, the subject matter of Examples 32-33 includes, wherein the maintenance trigger is a number of elements in the array of elements between the first pointer and the second pointer below a threshold.

In Example 35, the subject matter of Examples 29-34 includes, wherein elements in the array of elements between the first pointer and the second pointer, including the first pointer and not the second pointer, include storage portion references to storage portions in which data may be written.

In Example 36, the subject matter of Examples 29-35 includes, wherein elements in the array of elements between the second pointer and the third pointer, including the second pointer and not the third pointer, include storage portion references to storage portions that are invalid.

In Example 37, the subject matter of Examples 29-36 includes, wherein the array of elements is a circular array.

In Example 38, the subject matter of Examples 29-37 includes, wherein the first pointer, the second pointer, and the third pointer are stored in a reserved area of the storage class memory storage device that is distinct from a logical-to-physical translation area and a data area.

In Example 39, the subject matter of Example 38 includes, wherein the entire data structure is stored in the reserved area.

In Example 40, the subject matter of Examples 29-39 includes, wherein the entire data structure is stored in an area mixed with logical-to-physical translation area.

In Example 41, the subject matter of Examples 29-40 includes, wherein the storage portion is a page.

Example 42 is a system for storage class memory status, the system comprising: means for maintaining a storage portion characteristics data structure, the data structure comprising: an array of elements, each element sized to contain a reference to a storage portion in a storage class memory storage device; a first pointer to a first element in the array of elements; a second pointer to a second element in the array of elements; and a third pointer to a third element in the array of elements, the data structure including a direction of pointer motion, the second pointer preceding the third pointer and the first pointer preceding the second pointer with respect to the direction of pointer motion; means for receiving a write request; means for retrieving a storage portion reference from the first element; means for performing the write request to the storage portion reference; and means for advancing the first pointer.

In Example 43, the subject matter of Example 42 includes, means for retrieving an original storage portion reference for the write request from a translation table, the write request updating a previously stored value on the original storage portion; means for writing the original storage portion reference to the third element; and means for advancing the third pointer.

In Example 44, the subject matter of Examples 42-43 includes, means for performing maintenance upon a storage portion with a reference stored in the second element; and means for advancing the second pointer in response to the maintenance.

In Example 45, the subject matter of Example 44 includes, wherein the maintenance is performed in response to a maintenance trigger.

In Example 46, the subject matter of Example 45 includes, wherein the maintenance trigger is an idle condition of the storage device.

In Example 47, the subject matter of Examples 45-46 includes, wherein the maintenance trigger is a number of elements in the array of elements between the first pointer and the second pointer below a threshold.

In Example 48, the subject matter of Examples 42-47 includes, wherein elements in the array of elements between the first pointer and the second pointer, including the first pointer and not the second pointer, include storage portion references to storage portions in which data may be written.

In Example 49, the subject matter of Examples 42-48 includes, wherein elements in the array of elements between the second pointer and the third pointer, including the second pointer and not the third pointer, include storage portion references to storage portions that are invalid.

In Example 50, the subject matter of Examples 42-49 includes, wherein the array of elements is a circular array.

In Example 51, the subject matter of Examples 42-50 includes, wherein the first pointer, the second pointer, and the third pointer are stored in a reserved area of the storage class memory storage device that is distinct from a logical-to-physical translation area and a data area.

In Example 52, the subject matter of Example 51 includes, wherein the entire data structure is stored in the reserved area.

In Example 53, the subject matter of Examples 42-52 includes, wherein the entire data structure is stored in an area mixed with logical-to-physical translation area.

In Example 54, the subject matter of Examples 42-53 includes, wherein the storage portion is a page.

Example 55 is at least one machine-readable medium including instructions that, when executed by processing circuitry, cause the processing circuitry to perform operations to implement of any of Examples 1-54.

Example 56 is an apparatus comprising means to implement of any of Examples 1-54.

Example 57 is a system to implement of any of Examples 1-54.

Example 58 is a method to implement of any of Examples 1-54.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as horizontal, vertical, normal, parallel, perpendicular, etc., can refer to relative orientations, and are not intended to require strict adherence to specific geometric properties, unless otherwise noted. For example, as used herein, a vertical structure need not be strictly perpendicular to a surface of a substrate, but may instead be generally perpendicular to the surface of the substrate, and may form an acute angle with the surface of the substrate (e.g., between 60 and 120 degrees, etc.).

In some embodiments described herein, different doping configurations may be applied to a source-side select gate (SGS), a control gate (CG), and a drain-side select gate (SGD), each of which, in this example, may be formed of or at least include polysilicon, with the result such that these tiers (e.g., polysilicon, etc.) may have different etch rates when exposed to an etching solution. For example, in a process of forming a monolithic pillar in a 3D semiconductor device, the SGS and the CG may form recesses, while the SGD may remain less recessed or even not recessed. These doping configurations may thus enable selective etching into the distinct tiers (e.g., SGS, CG, and SGD) in the 3D semiconductor device by using an etching solution (e.g., tetramethylammonium hydroxide (TMCH)).

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMS), read only memories (ROMs), solid state drives (SSDs), Universal Flash Storage (UFS) device, embedded MMC (eMMC) device, and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A device comprising:
   a storage class memory array; and
   a controller including processing circuitry to perform operations comprising:
      maintaining a storage portion characteristics data structure that comprises:
         an array of elements, each element sized to store a reference to a storage portion in the storage class memory array, the array of elements being accessed as a circular array;
         a first pointer to a first element in the array of elements, the first pointer pointing to a start of a first list of elements in the array of elements, the first list of elements storing references to clean pages in the storage portion;
         a second pointer to a second element in the array of elements, the second pointer pointing to a start of a second list of elements in the array of elements, the second list of elements storing references to invalidated pages in the storage portion, the start of the second list of elements following an end of the first list of elements; and a third pointer to a third element in the array of elements, the third pointer pointing to a start, of a third list of elements in the array of elements, the third list of elements storing references to unencumbered pages in the storage portion, the start of the third list of elements following an end of the second list of elements, the storage portion characteristics data structure having a direction of pointer motion that determines whether any one of the first pointer, the second pointer, and the third pointer is incremented or decremented when advanced to another element in the array of elements;

receiving a write request; and in response to receiving the write request:
retrieving a storage portion reference from the first element;
performing the write request to the storage portion reference; and
advancing the first pointer.

2. The device of claim 1, wherein the operations further comprising:
retrieving, from a translation table, an original storage portion reference to an original storage portion in the storage class memory array, the write request to update a previously stored value on the original storage portion;
writing the original storage portion reference to the third element; and
advancing the third pointer.

3. The device of claim 1, wherein the operations further comprising:
performing maintenance upon a given storage portion with a reference stored in the second element; and
advancing the second pointer in response to performing the maintenance.

4. The device of claim 1, wherein each element in the first list of elements stores a given storage portion reference to a given storage portion that is available for writing data.

5. The device of claim 1, wherein each element in the second list of elements stores a given storage portion reference to a given storage portion that is invalid.

6. The device of claim 1, wherein the first pointer, the second pointer, and the third pointer are stored in a reserved area of the storage class memory array, the reserved area being distinct from a logical-to-physical translation area of the storage class memory array and distinct from a data content area of the storage class memory array.

7. The device of claim 6, wherein the storage portion characteristics data structure is stored in the reserved area.

8. A method comprising:
maintaining a storage portion characteristics data structure that comprises:
an array of elements, each element sized to store a reference to a storage portion in a storage class memory storage device, the array of elements being accessed as a circular array;
a first pointer to a first element in the array of elements, the first pointer pointing to a start of a first list of elements in the array of elements the first list of elements storing references to clean pages in the storage portion;
a second pointer to a second element in the array of elements, the second pointer pointing to a start of a second list of elements in the array of elements, the second list of elements storing references to elements in the storage portion, the start of the second list of elements following an end of the first list of elements; and
a third pointer to a third element in the array of elements, the third pointer pointing to a start of a third list of elements in the array of elements, the third list of elements storing references to unencumbered pages in the storage portion, the start of the third list of elements following an end of the second list of elements, the storage portion characteristics data structure having a direction of pointer motion that determines whether any one of the first pointer, the second pointer, and the third pointer is incremented or decremented when advanced to another element in the array of elements;

receiving a write request; and in response to receiving the write request:
retrieving a storage portion reference from the first element;
performing the write request to the storage portion reference; and
advancing the first pointer.

9. The method of claim 8, further comprising:
retrieving, from a translation table, an original storage portion reference to an original storage portion in the storage class memory storage device, the write request to update a previously stored value on the original storage portion;
writing the original storage portion reference to the third element; and
advancing the third pointer.

10. The method of claim 8, further comprising:
performing maintenance upon a given storage portion with a reference stored in the second element; and
advancing the second pointer in response to performing the maintenance.

11. The method of claim 8, wherein each element in the first list of elements stores a given storage portion reference to a given storage portion that is available for writing data.

12. The method of claim 8, wherein each element in the second list of elements stores a given storage portion reference to a given storage portion that is invalid.

13. The method of claim 8, wherein the first pointer, the second pointer, and the third pointer are stored in a reserved area of the storage class memory storage device, the reserved area being distinct from a logical-to-physical translation area of the storage class memory storage device and distinct from a data content area of the storage class memory storage device.

14. The method of claim 13, wherein the storage portion characteristics data structure is stored in the reserved area.

15. At least one computer readable medium including instructions that, when executed by processing circuitry, cause the processing circuitry to perform operations comprising:
maintaining a storage portion characteristics data structure that comprises:
an array of elements, each element sized to store a reference to a storage portion in a storage class memory storage device, the array of elements being accessed as a circular array;
a first pointer to a first element in the array of elements, the first pointer pointing to a start of a first list of elements in the array of elements, the first list of elements storing references to clean pages in the storage portion;

a second pointer to a second element in the array of elements, the second pointer pointing to a start of a second list of elements in the array of elements, the second list of elements storing references to invalidated pages in the storage portion, the start of the second list of elements following an end of the first list of elements; and a third pointer to a third element in the array of elements, the third pointer pointing to a start of a third list of elements in the array of elements, the third list of elements storing references to unencumbered pages in the storage portion, the start of the third list of elements following an end of the second list of elements, the storage portion characteristics data structure having a direction of pointer motion that determines whether any one of the first pointer, the second pointer, and the third pointer is incremented or decremented when advanced to another element in the array of elements;

receiving a write request; and in response to receiving the write request:
retrieving a storage portion reference from the first element;
performing the write request to the storage portion reference; and
advancing the first pointer.

16. The computer readable medium of claim 15, wherein the operations further comprise:
retrieving, from a translation table, an original storage portion reference to an original storage portion in the storage class memory storage device, the write request to update a previously stored value on the original storage portion;
writing the original storage portion reference to the third element; and
advancing the third pointer.

17. The computer readable medium of claim 15, wherein the operations further comprise:
performing maintenance upon a given storage portion with a reference stored in the second element; and
advancing the second pointer in response to performing the maintenance.

18. The computer readable medium of claim 15, wherein each element in the first list of elements stores a given storage portion reference to a given storage portion that is available for writing data.

19. The computer readable medium of claim 15, wherein each element in the second list of elements stores a given storage portion reference to a given storage portion that is invalid.

20. The computer readable medium of claim 15, wherein the first pointer, the second pointer, and the third pointer are stored in a reserved area of the storage class memory storage device, the reserved area being distinct from a logical-to-physical translation area of the storage class memory storage device and distinct from a data content area of the storage class memory storage device.

21. The computer readable medium of claim 20, wherein the storage portion characteristics data structure is stored in the reserved area.

* * * * *